United States Patent [19]

Hebard et al.

[11] 4,358,783

[45] Nov. 9, 1982

[54] SUPERCONDUCTING THIN FILMS

[75] Inventors: Arthur F. Hebard, Bernardsville; Joanna M. Vandenberg, Summit, both of N.J.

[73] Assignee: Bell Telephone Laboratories, Incorporated, Murray Hill, N.J.

[21] Appl. No.: 192,371

[22] Filed: Sep. 30, 1980

[51] Int. Cl.³ .............................................. H01L 39/22
[52] U.S. Cl. ......................................... 357/5; 427/62; 427/63; 307/306
[58] Field of Search .................... 357/5, 4; 427/62, 63; 307/306

[56] References Cited

U.S. PATENT DOCUMENTS 4,012,756  3/1977  Chaudhari .............................. 357/5

FOREIGN PATENT DOCUMENTS 1244011  8/1971  United Kingdom .

OTHER PUBLICATIONS

Hebard et al., *Bull. of Am. Phys. Soc.*, vol. 24, No. 3, Mar. 1979, p. 357.
Lihiri, *Appl. Phys. Lett.*, vol. 36, No. 4, Feb. 1980, pp. 334–336.
Kircher, *Science*, vol. 208, May 1980, pp. 944–950.
van der Drift, *Philips Res. Reports*, vol. 21, 1966, pp. 289–303.
Hansma et al., *Journ. of Appl. Phys.*, vol. 45, No. 9, pp. 4016–4024, Sep. 1974.
Ronay, *IBM Tech. Discl. Bull.*, vol. 22, No. 1, Jun. 1979, pp. 411–412.

*Primary Examiner*—Martin H. Edlow
*Attorney, Agent, or Firm*—Michael J. Urbano

[57] ABSTRACT

This invention relates to granular metal and metal oxide superconducting films formed by ion beam sputter deposition. Illustratively, the films comprise irregularly shaped, randomly oriented, small lead grains interspersed in an insulating lead oxide matrix. The films are hillock-resistant when subjected to thermal cycling and exhibit unusual Josephson-type switching characteristics. Depending on the oxygen content, a film may behave in a manner similar to that of a plurality of series connected Josephson junctions, or the film may have a voltage difference in a direction parallel to a major surface of the film that is capable of being switched from zero voltage difference to a finite voltage difference in response to a current larger than the critical current.

30 Claims, 6 Drawing Figures

SUPERCONDUCTING THIN FILMS

TECHNICAL FIELD

This invention relates to the field of superconducting devices having superconducting thin films, and more particularly, to a class of devices having superconducting films which are hillock-resistant when subjected to thermal cycling and which exhibit unique Josephson-type switching characteristics.

BACKGROUND OF THE INVENTION

A Josephson tunnel junction usually comprises a thin tunnel barrier layer sandwiched between two thin superconducting metallic films. The voltage across a Josephson junction is capable of rapidly switching from zero volts to a finite voltage when a critical current passes through the junction. As a result, Josephson devices are currently under consideration for use in logic and memory circuits.

Typically, a conventional Josephson junction may be formed by thermally evaporating a lead or other superconducting film onto a substrate in an evacuable chamber. The tunnel barrier may be formed by oxidizing the exposed surface of the lead film. A second lead film is then thermally evaporated onto the oxidized surface. The superconducting film contiguous with the substrate is known as the base electrode and the other superconducting film is known as the counter electrode.

It is known from the prior art that hillock formation on the electrodes is deleterious to the operation of conventional Josephson tunnel junctions of the type previously described. Hillocks are protrusions which develop on the surface of metallic thin films that are subjected to thermal cycling between temperature extremes (see Chaudari et al., U.S. Pat. No. 4,012,756, issued on Mar. 15, 1977). The superconducting films forming the base and counter electrodes in conventional Josephson tunnel junctions are susceptible to the formation of hillocks when the Josephson junctions are cycled between superconducting temperatures, on the order of 4 degrees Kelvin, and room temperatures, on the order of 300 degrees Kelvin, or photolithographic processing temperatures, on the order of 360 degrees Kelvin. Hillocks which form on the base electrode of a Josephson junction may protrude through the tunnel barrier and short circuit the junction. Accordingly, efforts have been directed to trying to find hillock-resistant superconducting films suitable for use in suepr-conducting devices such as Josephson tunnel junctions.

The voltage which develops across a Josephson junction device is characteristic of the materials comprising the base and counter electrodes. In the case of the previously mentioned lead-lead oxide-lead Josephson tunnel junction, the voltage is approximately equal to twice the energy gap of lead or about 2.5 millivolts. Thus, in order to utilize conventional Josephson junction technology for the formation of high voltage superconducting switches, it is necessary to connect a plurality of Josephson junctions in series. This usually involves numerous deposition steps or a complicated masking procedure (see Hebard, A. F. et al., "Diagnostics With Series Connected Josephson Tunnel-Junctions", *Journal of Applied Physics,* Vol. 49, No. 1, January 1978, p. 338). It would clearly be advantageous to produce series connected Josephson tunnel junctions in a single deposition step.

In addition to the previously mentioned thermal evaporation technique for forming lead films, other techniques for the formation of lead or other superconducting metal films are taught in the prior art. One such technique involves the reactive ion beam-sputter deposition of a metal in the presence of oxygen (see Castellano, R. N., "Reactive Ion Beam Sputtering of Thin Films of Lead, Zirconium, and Titanium", *Thin Solid Films,* Vol. 46, 1977, pp. 213–221).

Castellano directed a beam of energetic ions at a metal target in an evacuable chamber having an atmosphere of oxygen. By a momentum transfer mechanism atoms on or near the surface of the target were ejected and deposited on a suitable substrate as a thin film comprising metal and metal oxide. Castellano studied the deposition rate, resistivity, and internal stress of the films as a function of the partial pressure of oxygen which was varied from approximately $1 \times 10^{-6}$ Torr to approximately $2 \times 10^{-4}$ Torr, but did not propose fabrication of Josephson junctions or other superconducting devices from the films.

SUMMARY OF THE INVENTION

The present invention relates to unique superconducting devices which can be formed using films produced by the reactive ion beam sputter deposition of a superconducting metal such as lead, tin, or aluminum in the presence of oxygen. The ion beam deposited films are hillock-resistant when subjected to thermal cycling between temperature extremes and also exhibit unique Josephson type switching properties.

In accordance with a first aspect of the invention, a superconducting device includes a superconducting thin film which is hillock-resistant when subjected to thermal cycling and means for applying electric current to the film. The film comprises submicron irregularly shaped metal grains interspersed in an insulating matrix which includes one or more oxides of the metal and can be formed by reactive ion beam sputtering. Although all of the atomic planes within a given grain have substantially the same spatial orientation, this spatial orientation differs randomly from grain to grain. Depending on the oxide content of the film, which is determined by the ion beam current and the partial pressure of the oxygen during deposition, the volume fraction of the film occupied by oxide is smaller than, comparable to, or greater than the volume fraction of the film occupied by the metal grains. Illustratively, the device is a Josephson junction having an ion beam sputtered film for a base electrode. Advantageously, this inventive Josephson junction is resistant to the formation of hillocks and is capable of surviving at least several thermal cycles between approximately 4 degrees Kelvin and room temperature or higher.

In accordance with a second aspect of the invention, a superconducting device comprises a thin superconducting film, having a pair of substantially parallel spaced apart major surfaces, and means for applying an electric current to the film in a direction parallel to the major surfaces. The film comprises a string of irregularly shaped clusters of irregularly shaped small metal grains. The grains have a plurality of spatial orientations and are interspersed in a metal oxide matrix. Each cluster has a width essentially coextensive with the width of the film. Tunnel barriers comprising one or more oxides of the metal separate the adjacent clusters. The current-voltage characteristic of this type of film is substantially indistinguishable from the current-voltage characteristic of a plurality of series connected Josephson tunnel junctions. This type of film may be produced using reactive ion beam sputter deposition in the presence of oxygen. The oxygen partial pressure and the ion beam current should be maintained at levels whereby a film having the above-mentioned desirable current-voltage characteristic results. Advantageously, the single film equivalent of a plurality of series connected Josephson devices is produced using only a single deposition step.

In accordance with a third aspect of the invention, a superconducting device includes a superconducting thin film, having a pair of substantially parallel spaced-apart major surfaces, and electrode means for applying an electrode current to the film in a direction parallel to the major surfaces. The film comprises irregularly shaped small metal grains, having a plurality of spatial orientations, and an insulating matrix in which the grains are interspersed comprising at least one oxide of the metal. For this aspect of the invention, the grains form a single cluster having an area substantially coextensive with the area of either major surface of the film. The current, when having a value larger than a critical value, is capable of switching the voltage difference across the film in the direction of the current from a first voltage difference to a second voltage difference.

This type of film may also be produced by ion beam sputtering in the presence of oxygen. The partial pressure of oxygen and the ion beam current should be maintained at sufficient levels so that a film having the previously mentioned desirable switching property results.

It is the oxygen content of the film which substantially determines whether the film comprises a single cluster of metal grains or a plurality of clusters of metal grains with each cluster being separated from the adjacent ones by a metal oxide tunnel barrier. For a given value of ion beam current, the oxygen partial pressure may be selected to form one type of film or the other.

A typical thin film superconductor switches to the normal state with a sheet resistance of about 1 ohm per square. Advantageously, in one particular embodiment, the films of the third aspect of the invention can switch from the superconducting state to the normal state with a sheet resistance of about 100 ohms per square in response to a critical current in the range of 1-10 milliamps. These current levels are compatible with existing discrete Josephson devices, and the voltage levels which these films exhibit may be useful in impedance matching applications. There may also be applications to superconducting weak link technology in which high critical current-resistance ($I_cR$) products are desirable.

DETAILED DESCRIPTION

Figure 1:
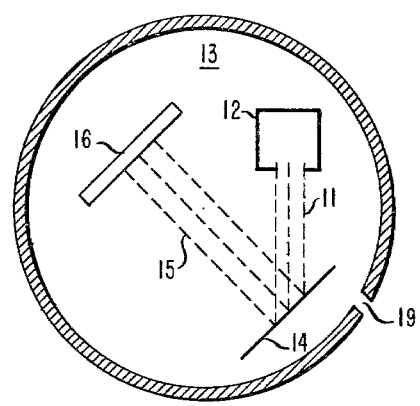
FIG. 1 illustrates an ion beam sputter deposition system of the type found in the prior art.

In accordance with a particular embodiment of the invention, the inventive superconducting devices include superconducting thin films which can be formed by the ion beam sputter deposition apparatus shown schematically in FIG. 1. This apparatus and the resulting devices are intended to be illustrative only, and, unless otherwise, indicated, numerical parameters stated in connection with the apparatus and the resulting devices are not intended as limitations on the scope of the invention.

Illustratively, granular lead and lead oxide films may be formed by directing a beam of ions 11 (e.g. argon ions) from ion gun 12, located in evacuable chamber 13, onto lead target 14. Oxygen is bled into evacuable chamber 13 through inlet 19 from a source not shown. Alternatively, oxygen can be introduced into the ion gun thereby including oxygen ions in the ion beam incident on the target. Illustratively, the beam energy is in the approximate range of 0.5-3.0 kilovolts and the current density is about 0.5 mA/cm². The sputtered lead and resulting lead oxide 15 are deposited onto an insulating substrate 16 at a rate of about 1-2 angstroms/sec for a total film thickness of about 200-1000 angstroms. The lead oxide may be formed near the target, in transit between the target and substrate, or near the substrate. By controlling the partial pressure of oxygen and/or the ion beam current during the deposition, it is possible to control the oxygen content of the resulting films. Films with a normal state sheet resistance of approximately 10 $\Omega$/square to approximately $10^8$ $\Omega$/square can be produced. The films have a lead grain size of approximately 100-200 angstroms and are mechanically and electrically stable with respect to temperature cycling between temperature extremes. In the presence of air at room temperature, the resistance of the reactive ion beam sputter deposited lead films, is relatively stable, rather than undergoing further oxidation and eventually becoming insulating as is true for lead films evaporated from resistively heated sources in the presence of oxygen. (See Hansma, P. K., et al., *Journal of Applied Physics*, Vol. 45, No. 9, 1974, p. 4016).

Pb films formed by ion beam sputter deposition in the absence of oxygen are rough in texture and contain large wiskers, whereas films deposited in a mixture of oxygen and argon show a uniform and fine-grained structure which is essentially free of wiskers. For a fixed argon pressure during deposition, the grain size decreases and the resistivity increases with increasing oxygen pressure. For a fixed oxygen pressure during deposition, the grain size decreases and the resistivity remains approximately the same with increasing argon pressure. At relatively high oxygen concentrations, the higher lead oxide $Pb_3O_4$ is formed. The fact that only PbO has been previously observed in thermally evaporated Pb films deposited under even higher oxygen partial pressure (See Van der Drift, A., Philips Research Report, Vol. 21, 1966, page 289) strongly indicates that the non-equilibrium reactive ion beam sputtering process is basically different from a thermal evaporation process in film formation. In addition, the Pb grains in the ion beam deposited films are randomly oriented as opposed to the strong preference toward a uniform orientation often exhibited by thermally evaporated lead films.

Figure 2:
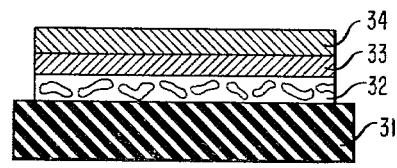
FIG. 2 illustrates a Josephson junction in accordance with an illustrative embodiment of the invention.

The ion beam sputter deposition of lead with a beam current on the order of 0.5 Amps/cm$^2$ and an oxygen partial pressure in the approximate range of 10$^4$ Torr to 10$^{-3}$ Torr results in films comprising randomly oriented submicron lead grains interspersed in an insulating lead oxide matrix. Films made under these circumstances are smooth enough for use in Josephson devices such as Josephson tunnel junctions. Josephson junctions using the ion beam deposited films for the base electrode are hillock-resistant over at least several thermal cycles between approximately 4 degrees Kelvin and processing temperatures used in photolithography which are on the order of 360 degrees Kelvin. An example of an inventive Josephson junction is shown in FIG. 2. Ion beam deposited lead and lead oxide film 32 forms the base electrode and is deposited on insulating substrate 31. Insulating layer 33 forms the tunnel barrier and thermally deposited lead film 34 forms the counter electrode. An ion beam deposited granular lead film could also be used to form the counter electrode.

Figure 3:
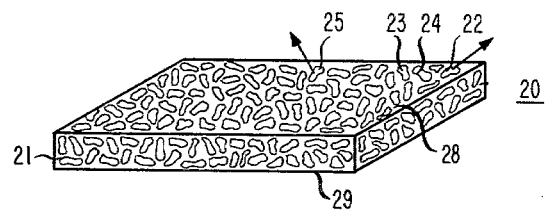
FIG. 3 schematically illustrates a lead and lead oxide superconducting film deposited with the apparatus of FIG. 1 in accordance with an illustrative embodiment of the invention.

FIG. 3 schematically illustrates an ion beam deposited lead film 20. Illustratively, irregularly shaped, randomly oriented submicron lead grains 21, 22, 23, 24, and 25 are interspersed in lead oxide insulating matrix 26. Arrows attached to grains 25 and 22 indicate the orientation of the atomic planes of these two particular grains. The metallic grains occupy a fraction of the volume of the film ranging from approximately 25 percent to approximately 75 percent. It is hypothesized that occasionally the boundaries of two lead grains are within approximately 25 angstroms of each other. These grains are then close enough to each other for Josephson tunneling to take place between the two grains. Electrical conduction over macroscopic regions results when this occurs. Illustratively, grains 23 and 24 of FIG. 3 are close enough for tunneling to take place between them. This is the primary means of electron conduction in any direction parallel to major surfaces 28 and 29 of film 20.

Figure 4:
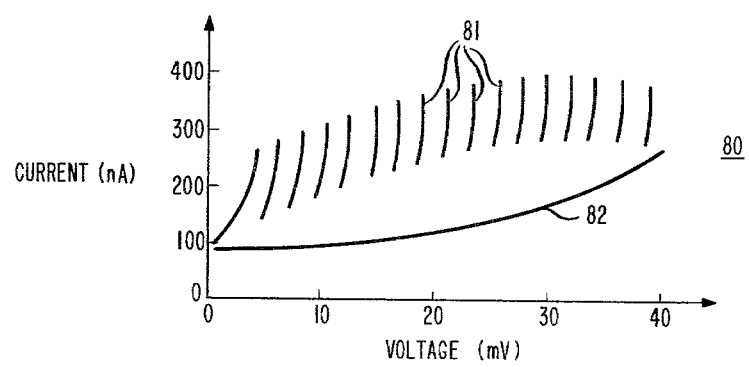
FIG. 4 shows the current-voltage characteristic of a superconducting device which functionally is substantially equivalent to a plurality of series connected Josephson junctions, in accordance with an illustrative embodiment of the invention.

The ion beam deposited films can be incorporated into devices, other than the conventional three layer Josephson devices, which exhibit unusual Josephson-type switching properties. FIG. 4 illustrates the current-voltage characteristic 80 of a 20 μm wide by 2 mm long film which has a room temperature or normal state sheet resistance of 9400 Ω/square. The current-voltage characteristic was taken at 1.4 degrees K. As the current increases, the current-voltage characteristic 80 exhibits steps 81 separated in voltage by twice the energy gap (2Δ) of lead. Curve 82 is the return path which is exhibited as the current decreases. This I-V curve is essentially equivalent to the I-V curve of a plurality of series connected Josephson junctions. Granular lead films exhibiting a total of approximately 100 hysteretic steps for a total voltage of approximately 250 mV have been produced using ion beam sputter deposition in the presence of oxygen.

Figure 5:
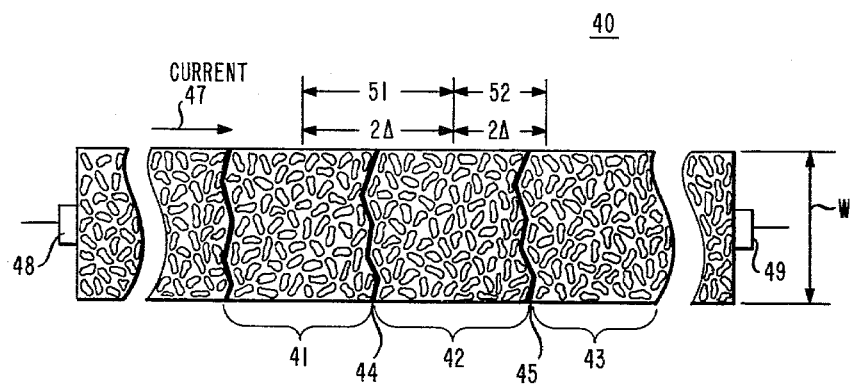
FIG. 5 schematically illustrates a superconducting device having a film comprising a string of clusters of lead grains which are interspersed in a lead oxide matrix, each cluster being separated from the adjacent clusters by a lead oxide barrier, in accordance with an illustrative embodiment of the invention.

An illustrative superconducting device having the I-V curve of FIG. 4 is shown schematically in FIG. 5. Film 40 comprises clusters 41, 42 and 43 of lead grains with adjacent clusters separated by lead oxide barriers 44 and 45. Clusters are macroscopic aggregations of strongly coupled grains which are interspersed in the oxide matrix. Film 40 includes a plurality of series connected Josephson junctions 51 and 52, each formed by two clusters of lead grains separated by a lead oxide barrier. When current 47, applied to the film by electrode means 48 and 49 exceeds the critical currents of Josephson junctions 51 and 52, a voltage drop 2Δ appears across each of Josephson junctions 51 and 52 thereby giving rise to an I-V curve of the type shown in FIG. 4. Typical critical currents for films having the properties exhibited in FIGS. 4 and 5 are on the order of several hundred nanoamps. The critical currents between grains within a cluster are sufficiently high so that the voltage drop within a cluster is close to zero. In order for a film to exhibit the series connected behavior of FIGS. 4 and 5, the film should be dimensioned so that the cluster width W is substantially coextensive with the width of the film of FIG. 5. Films having a normal state sheet resistance in the approximate range of 500 Ω/square to 10,000 Ω/square can exhibit series connected behavior.

The apparatus of FIG. 1 can be used to produce films exhibiting series connected Josephson behavior. Illustratively, an ion beam current density on the order of 0.5 Amps/cm$^2$ and an oxygen partial pressure in the range of approximately $5 \times 10^{-4}$ Torr to approximately $10^{-3}$ Torr yields films having a sufficient oxide content to exhibit the desired behavior. Since the oxide content of the film can be controlled by varying the oxygen partial pressure and/or the ion beam current, other values of beam current and pressure can be expected to result in films which have sufficient oxide content to exhibit series connected Josephson behavior.

As the sheet resistance of the films increases with increasing oxidation of the grains, the diminished superconducting coupling between grains gives rise to smaller clusters. This behavior is confirmed in a qualitative manner by the appearance of I-V characteristics which cross over from the series connected behavior of FIG. 4 to a series-parallel behavior (See Hansma, et al., supra) in which the voltage steps are diminished in magnitude and appear superimposed on a rising conductance background. For films having a normal state sheet resistance larger than approximately 30,000 Ω/square the discrete steps almost totally disappear. It should be noted that it is not the superconductivity of the grains, but rather the superconducting coupling between the grains, which disappears when the normal state sheet resistance exceeds approximately 30,000 Ω/square. Series-parallel behavior is observed whenever the characteristic dimensions of the major surfaces of the film are several times larger than the characteristic dimensions of the clusters. Currently flowing parallel to a major surface of this type of film may flow along numerous interconnected paths, thus giving rise to the series-parallel behavior.

On the other hand, when the normal state sheet resistance decreases below approximately 500 Ω/square due to decreased oxidation of the grains, the grains can form a single "giant cluster" having an area essentially coextensive with the area of a major surface of the film. The film of FIG. 3 has only a single cluster. Illustratively, a device including a film comprising a giant cluster and electrode means for applying current in a direction parallel to a major surface of the device can exhibit the unique I-V characteristics shown in FIG. 6. The I-V curve 50 of FIG. 6 was exhibited by a film approximately 20 μm wide by 2000 μm long at approximately 4.2 degrees K. when current was applied in a direction parallel to the major surfaces of the film. For currents smaller than the critical current, $I_c$, no voltage difference appears across the film in the direction of current flow. When the current exceeds $I_c$, the film switches from point O to point A of FIG. 6. Illustratively, point A of FIG. 6 has a voltage of approximately 1 volt and an operating current $I_o$, of approximately 1.6 mA. Between points A and B on I-V curve 50, the current is independent on the voltage. The I-V curve 50 exhibits hysteresis, and, as the current is decreased, the voltage moves along path BADC of curve 50. The physical mechanism giving rise to the unique switching properties of I-V curve 50 is not well understood at the present time. Curve 51 of FIG. 5 is the normal state I-V curve for the same granular lead film and is shown only for the purpose of comparison.

Figure 6:
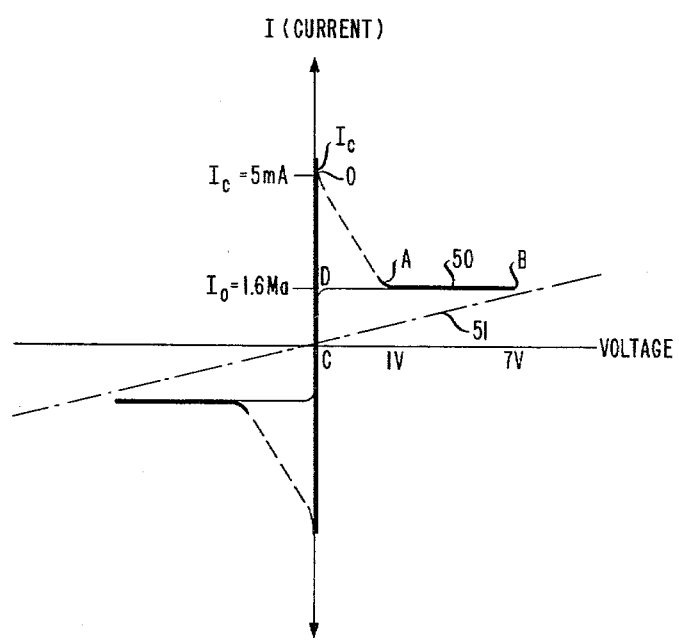
FIG. 6 shows the current-voltage characteristic of a superconducting device including a thin superconducting film capable of switching from a first voltage difference to a second voltage difference in a direction parallel to a major surface of the film when a current, larger than a critical current, is applied to the film in that direction; in accordance with an illustrative embodiment of the invention.

Ion beam deposited granular lead films having a normal state sheet resistance in the approximate range of 10 Ω/square to 500 Ω/square can exhibit an I-V curve of the type illustrated in FIG. 6. Illustratively, using the ion beam sputter deposition apparatus of FIG. 1, a beam current on the order of 0.5 mA/cm² and an oxygen partial pressure in the range of approximately $1 \times 10^{-4}$ Torr to approximately $5 \times 10^{-4}$ Torr result in a film having sufficient oxide content to exhibit the switching properties of FIG. 6. Other combinations of beam current and oxygen partial pressure also result in this type of film.

As previously mentioned, films having an I-V curve of the type shown in FIG. 6 may eventually be useful as high resistance and high voltage superconducting switches. This type of superconducting switch is formed using a single deposition step while the usual superconducting Josephson junction switch has three layers and thus requires a plurality of deposition steps.

It is to be understood that the above-described devices and associated deposition techniques are merely illustrative of the many specific embodiments which can be devised to represent the application of the principles of the invention. For example, with thicker films one might expect the clusters to be three dimensional, rather than two dimensional, and electrical conduction in an additional dimension should be taken into account. Numerous and varied arrangements can be devised in accordance with these principles by those skilled in the art without departing from the spirit and scope of the invention as encompassed by the following claims.

We claim:

1. A superconducting device including:
a thin superconducting film; and
means for applying an electric current to said film; said film comprising;
 irregularly shaped small metal grains having a plurality of orientations; and
 an insulating matrix, in which said grains are interspersed, comprising at least one oxide of said metal;
 whereby said film is hillock-resistant when subjected to thermal cycling.

2. The device of claim 1 wherein said insulating matrix includes at least two oxides of said metal.

3. The device of claim 1 wherein said metal is lead and said oxide is at least one lead oxide.

4. The device of claim 2 or 3 wherein said oxides include PbO and $Pb_3O_4$.

5. A superconducting device including:
a superconducting film; and
means for applying an electric current to said film; said device being formed by a process including the steps of:
 partially evacuating an evacuable chamber;
 maintaining therein an atmosphere including oxygen;
 directing a beam of ions at a metal target within said chamber, thereby depositing said superconducting film comprising said metal and oxide of said metal on a substrate within said evacuable chamber, whereby said film is hillock-resistant when subjected to thermal cycling; and
 forming electrode means for applying current to said film.

6. The superconducting device of claim 5 wherein said metal is lead and said oxide is at least one lead oxide.

7. A Josephson junction device comprising:
a first superconducting film;
a film contiguous with said first film forming a tunnel barrier; and
a second superconducting film contiguous with said tunnel barrier;
at least one of said first and second superconducting films comprising:
 irregularly shaped small metal grains having a plurality of orientations; and
 an insulating matrix, in which said grains are interspersed, comprising at least one oxide of said metal, whereby the film forming at least one of said first and second superconducting films is hillock-resistant when subjected to thermal cycling.

8. The Josephson device of claim 7 wherein said metal is lead and said oxide is at least one lead oxide.

9. A Josephson junction device comprising:
a first superconducting film;
a film contiguous with said first film forming a tunnel barrier; and
a second superconducting film contiguous with said tunnel barrier;
at least one of said first and second sueprconducting films being produced by a process including the steps of;
partially evacuating an evacuable chamber;
maintaining therein an atmosphere including oxygen; and
directing a beam of ions at a metal target within said chamber, thereby depositing said superconducting film comprising metal and oxide of said metal on an insulating body within said evacuable chamber; whereby said film forming at least one of said first and second superconducting films is hillock-resistant when subjected to thermal cycling.

10. The device of claim 9 wherein said metal is lead and said oxide is at least one lead oxide.

11. A superconducting device including:
a thin superconducting film having a pair of substantially parallel spaced-apart major surfaces; and
electrode means for applying an electric current to said film in a direction parallel to said surfaces;
said film comprising:

a string of n irregularly shaped clusters of irregularly shaped small metal grains, said grains having a plurality of orientations and being interspersed in a metal oxide insulating matrix, each cluster having a width substantially coextensive with the width of said film; and (n−1) barriers comprising at least one oxide of said metal to separate adjacent clusters, whereby;

the current-voltage characteristic of said device is substantially indistinguishable from the current-voltage characteristic of a plurality of (n−1) series connected Josephson tunnel junctions.

12. The device of claim 11 wherein said metal is lead and said metal oxide is at least one lead oxide.

13. A superconducting device including:

a thin superconducting film having a pair of substantially parallel major surfaces; and electrode means for applying an electric current to said film in a direction parallel to said surfaces;

said device being formed by a process including the steps of;

partially evacuating an evacuable chamber;

maintaining therein an atmosphere including oxygen;

directing a beam of ions at a metal target within said chamber thereby depositing said superconducting film comprising said metal and oxide of said metal on a substrate within said chamber; and forming electrode means for applying current to said film in a direction parallel to said major surfaces;

the partial pressure of said oxygen and said beam current being maintained at sufficient levels whereby;

the current-voltage characteristic of said device is substantially indistinguishable from the current-voltage characteristic of a plurality of series connected Josephson tunnel junctions.

14. The superconducting device of claim 13 wherein said metal is lead and said oxide is at least one lead oxide.

15. A superconducting device including:

a superconducting thin film having a pair of substantially parallel spaced-apart major surfaces; and electrode means for applying an electric current to said film in a direction parallel to said surfaces;

said film comprising:

irregularly-shaped small metal grains having a plurality of orientations; and an insulating matrix, in which said grains are interspersed, comprising at least one oxide of said metal;

said grains forming a cluster having an area essentially coextensive with said film; whereby said current, when having a value larger than a critical value, is capable of switching the voltage difference across said film in said direction from a first voltage difference to a second voltage difference.

16. The device of claim 15 wherein said metal is lead and said oxide is at least one lead oxide.

17. A superconducting device including:

a thin superconducting film having a pair of substantially parallel spaced-apart major surfaces; and electrode means for applying an electric current to said film in a direction parallel to said surfaces;

said device formed by a process including the steps of:

partially evacuating an evacuable chamber;

maintaining an atmosphere including oxygen therein; and directing a beam of ions at a metal target within said chamber thereby depositing said superconducting film comprising said metal and oxide of said metal on a substrate within said evacuable chamber; and forming electrode means for applying current to said film in a direction parallel to said surfaces;

the partial pressure of said oxygen and said beam current being maintained at sufficient levels whereby;

said current, when having a value larger than a critical value, is capable of switching the voltage difference across said film in said direction from a first voltage difference to a second voltage difference.

18. The device of claim 17 wherein said metal is lead and said oxide is at least one lead oxide.

19. A process for forming a superconducting device, having a thin superconducting film, including the steps of:

partially evacuating an evacuable chamber;

maintaining therein an atmosphere including oxygen;

directing a beam of ions at a metal target within said chamber, thereby depositing said superconducting film comprising said metal and oxide of said metal on a substrate within said chamber, whereby said film is hillock-resistant when subjected to thermal cycling; and forming electrode means coupled to said film for applying an electric current to said film.

20. The process of claim 19 wherein said metal is lead and said oxide is at least one lead oxide.

21. The process of claim 20 wherein said film has a normal state sheet resistance in the range of 10 $\Omega$/square to $10^8$ $\Omega$/square.

22. The process of claim 20 wherein:

said maintaining step includes maintaining the partial pressure of said oxygen in the approximate range of $10^{-4}$ Torr to $10^{-3}$ Torr; and said directing step includes directing a beam of ions at said target, said beam having a current density on the order of 0.5 mA/cm$^2$ and a voltage in the approximate range of 0.5–3 Kev.

23. A process for forming a superconducting device, having a thin superconducting film, including the steps of:

partially evacuating an evacuable chamber;

maintaining therein an atmosphere including oxygen;

directing a beam of ions at a metal target within said chamber, thereby depositing said superconducting film comprising said metal and oxide of said metal on a substrate within said evacuable chamber; and forming electrode means for applying an electric current to said film in a direction parallel to a major surface of said film;

the partial pressure of said oxygen and the ion beam current being maintained at sufficient levels whereby:

the current-voltage characteristic of said device is substantially indistinguishable from the current voltage characteristic of a plurality of series connected Josephson tunnel junctions.

24. The process of claim 23 wherein said metal is lead and said oxide is at least one lead oxide.

25. The process of claim 24 wherein said film has a normal state sheet resistance in the approximate range of 500 Ω/square to 10,000 Ω/square.

26. The process of claim 24 wherein the partial pressure of oxygen is maintained in the approximate range of $5 \times 10^{-4}$ Torr to $10^{-3}$ Torr and said ion beam current density is on the order of 0.5 mA/cm$^2$.

27. A process for forming a superconducting device, having a thin superconducting film, including the steps of:

partially evacuating an evacuable chamber;
maintaining therein an atmosphere including oxygen;
directing a beam of ions at a metal target within said chamber, thereby depositing said superconducting film comprising said metal and oxide of said metal on a substrate within said evacuable chamber; and
forming electrode means for applying an electric current to said film in a direction parallel to a major surface of said film;
the partial pressure of said oxygen and the ion beam current being maintained at sufficient levels whereby:
said current, when having a value larger than a critical value, is capable of switching the voltage difference across said film in said direction from a first voltage difference to a second voltage difference.

28. The process of claim 27 wherein said metal is lead and said oxide is at least one lead oxide.

29. The process of claim 28 wherein said film has a normal state sheet resistance in the approximate range of 10 Ω/square to 500 Ω/square.

30. The process of claim 28 wherein the partial pressure of oxygen is maintained in the approximate range of $1 \times 10^{-4}$ Torr to $5 \times 10^{-4}$ Torr and said ion beam current density is on the order of 0.5 mA/cm$^2$.

* * * * *